(12) United States Patent
Liardet et al.

(10) Patent No.: US 7,117,474 B2
(45) Date of Patent: Oct. 3, 2006

(54) USE DETECTING CIRCUIT (75) Inventors: Pierre-Yvan Liardet, Peynier (FR); Bruno Mussard, Les Pennes Mirabeau (FR)

(73) Assignee: STMicroelectronics SA, Montrouge (FR)

( * ) Notice: Subject to any disclaimer, the term of this patent is extended or adjusted under 35 U.S.C. 154(b) by 292 days.

(21) Appl. No.: 10/312,125

(22) PCT Filed: Jun. 18, 2001

(86) PCT No.: PCT/FR01/01891

§ 371 (c)(1),
(2), (4) Date: Dec. 18, 2002

(87) PCT Pub. No.: WO01/99113

PCT Pub. Date: Dec. 27, 2001

(65) Prior Publication Data
US 2003/0182562 A1 Sep. 25, 2003

(30) Foreign Application Priority Data
Jun. 19, 2000 (FR) .................................. 00 07762

(51) Int. Cl.
G06F 17/50 (2006.01)

(52) U.S. Cl. .................. 716/17; 716/1; 365/185.01
(58) Field of Classification Search ............. 716/1–17, 716/18; 365/189.05–189.33, 365, 185, 185.01
See application file for complete search history.

(56) References Cited

U.S. PATENT DOCUMENTS

| 5,668,756 | A  | * | 9/1997  | Tomioka ............... 365/185.03 |
| 5,682,345 | A  | * | 10/1997 | Roohparvar et al. ... 365/185.04 |
| 5,968,183 | A  | * | 10/1999 | Pascucci ................. 714/6 |
| 5,978,261 | A  | * | 11/1999 | Tailliet .................. 365/185.01 |
| 6,292,394 | B1 | * | 9/2001  | Cohen et al. ........... 365/185.19 |
| 6,330,185 | B1 | * | 12/2001 | Wong et al. ............ 365/185.03 |
| 6,538,929 | B1 | * | 3/2003  | Hiraki et al. ........... 365/189.05 |
| 6,600,676 | B1 | * | 7/2003  | Shibata et al. ......... 365/185.04 |
| 6,708,319 | B1 | * | 3/2004  | Adachi et al. ................. 716/5 |

* cited by examiner

*Primary Examiner*—Jack Chiang
*Assistant Examiner*—Binh Tat
(74) *Attorney, Agent, or Firm*—Lisa K. Jorgenson; Allen, Dyer, Doppelt, Milbrath & Gilchrist, P.A.

(57) ABSTRACT

A circuit to detect the use of an element of an integrated circuit may include a non-volatile electrically programmable storage circuit and a programming circuit. The programming circuit may be used to partially program the storage circuit and gradually modify its programming level as the element is used so that the level represents the number of uses of the element.

28 Claims, 3 Drawing Sheets

USE DETECTING CIRCUIT

FIELD OF THE INVENTION

The present invention relates to the field of integrated circuits, and, more particularly, to a use detection circuit for an integrated circuit producing or using sensitive security data. More specifically, the invention may be used for reporting the unauthorized use of an element of an integrated circuit producing or using such sensitive data. The invention is particularly well suited for use in integrated circuits for smart cards that produce or use secret data, but it may also be used for other integrated circuit elements using sensitive data which requires protection from external attack.

BACKGROUND OF THE INVENTION

Sensitive security data may include, for example, personal data identifying the owner or manufacturer of an integrated circuit, keys, initials or derivatives, data encryption algorithms, etc. Such data may be produced or used, for example, by elements of an integrated circuit. As used herein, the term "element" is to be understood in the broad sense of the term. That is, this term may designate, for example, an identification circuit or cryptographic computation circuit of an integrated circuit, or simply a portion of one of these circuits. The term "element" also designates an instruction, a particular sequence of instructions, or a step of a process that is implemented by the integrated circuit and which, during its execution, leads to the production or use of sensitive data.

Known snooping techniques often take advantage of the changes undergone by a physical variable inherent to an integrated circuit that is measurable from outside the circuit. A variable of this kind may be, for example, the total energy consumption of the circuit or its electromagnetic radiation. In particular, to access sensitive data from outside the circuit, a snooper activates the operation of an element that produces or uses this sensitive data, measures a physical variable that is externally accessible, and searches for a correlation between this variable and the sensitive data.

One of the main difficulties for the snooper lies in the fact that the measurement of the variable is particularly difficult because it is generally noise-ridden. That is, the physical variable is produced by the entire integrated circuit and not solely by the element(s) producing or manipulating the sensitive data. The snooper then needs to have a large number of identical measurements at his disposal (e.g., about 2,000 to 20,000 measurements) to remove the noise from the measurement and extract the sensitive data.

To prevent such an attack, the user may take preventive action if an element producing or using the sensitive data is subjected to excessively frequent action. For example, he may disable the operation of the element, i.e., disable the operation of the circuit, portion of the circuit, instruction, or the particular series of instructions that produces or uses the sensitive data. The user may also act preventively by replacing the sensitive data element(s) with another data element(s), if this option is available, or modify the mechanism for producing this data.

For this purpose, the user must be able to know how many times the element producing or using the sensitive data has been used, or he must have at least an estimate of this number, to find out whether or not the element is being used wrongfully. He may deem this to be the case when the number of uses or the estimate of this number has reached a chosen value N, such as 1,000 or 10,000. The user may then take preventive action by blocking the operation of the integrated circuit, preventing the production or use of the sensitive data to be protected, or modifying the value of the sensitive data.

There are existing prior art approaches that generally use a counter to determine the number of productions or uses of the element using the sensitive data. However, one drawback of a counter is that a large memory cell may be needed to store the number. The surface and the consumption of the counter itself, as well as the time needed to program the counter, may also be significant, especially if the count is large. Furthermore, if the counter has a reset device, then this reset device is generally quite easily accessible from outside the circuit, allowing a snooper to then erase the contents of the counter.

SUMMARY OF THE INVENTION

It is an object of the invention to provide a use detection circuit that indicates the number of uses of an element producing or using sensitive data and, as the case may be, which reports when a maximum number of uses has been exceeded, where the maximum number is user defined.

Other objects of the invention are to provide a detection circuit requiring relatively less integration area, which has increased speed of operation, and which preserves a trace of the past history of the element with which it is connected and cannot be easily erased or reset.

These and other objects and advantages of the invention are provided by a circuit for the detection of use of a sensitive element of an integrated circuit which may include a non-volatile electrically programmable storage circuit and a programming circuit. The programming circuit may partially program the storage circuit and gradually modify its programming level as the sensitive element is used. This may be done so that this level represents the number of uses of the sensitive element.

Again, as used herein an "element" may be a circuit or a part of a circuit that produces or uses sensitive data to be protected. An element may also be an instruction or a particular series of instructions which, when executed, introduces or uses the sensitive data. The programming level of the storage circuit thus at least approximately represents the number of partial programming operations performed, and therefore the number of uses of the element. The maximum number of permitted uses may be defined, for example, by the user. With the rate of use of the element being known, the user may then act preventively if necessary, such as by blocking operation of the element, modifying the value of the sensitive data, or modifying the mechanism that produces of the sensitive data, for example.

Additionally, the circuit also include a measurement circuit to measure the level of programming of the storage circuit and produce a warning signal if this level reaches a reference level representing a maximum number of permitted uses of the sensitive element. The user is thus directly informed by the warning signal if the number of permitted uses is exceeded. In such embodiment, the use detection circuit may potentially be somewhat less precise than a counter, as shall be seen hereinafter. Nonetheless, the detection circuit of the invention provides an accurate estimation of the number of uses of the element or elements (e.g., with an accuracy of within 5 or 10 percent), and this estimate is sufficient to enable the user to take preventive action.

Furthermore, the storage circuit may include at least one programmable storage cell operable by partial programming steps. The storage cell may be, for example, an EEPROM, EPROM or FLASH. The use detection circuit of the invention is thus more reliable than a circuit with a counter because, unlike a counter, an EEPROM, EPROM or FLASH storage device cannot be as easily reset. The detection circuit of the invention therefore keeps a trace, in time, of element usage of the integrated circuit to which it is connected. Furthermore, the detection circuit of the invention is far smaller than prior art circuits which include a counter since an EPROM, EEPROM, FLASH, etc., storage cell is typically much smaller in size.

The detection circuit according to the invention may advantageously include a complementary output circuit to store the warning signal produced by the measurement circuit. The user can therefore know at all times whether a warning signal has been sent by the measurement circuit simply by verifying the contents of the output circuit.

The storage circuit may have several storage cells used successively when the element is used. A storage cell is used when a previous storage cell has reached a maximum level. This is done so that the programming level of the last programmed storage cell added to the maximum level of the previous programmed cell or cells represents the number of uses of the element.

Also, the storage circuit may include several storage cells where each storage cell is used to store the number of uses of the sensitive element of the integrated circuits associated with the storage cell. This is done so that the programming level of each storage cell represents the number of uses of the sensitive element associated therewith. The detection circuit according to the invention may furthermore advantageously be complemented by disabling means or circuitry to disable operation of the programming circuit, thus limiting the power consumption of the use detection circuit.

A method aspect of the invention is for detecting the use of a sensitive element of an integrated circuit and may include partially programming an electrically programmable non-volatile storage circuit when the sensitive element is used. This is done so that the programming level of the storage circuit is gradually modified as the sensitive element is used. Thus, whenever an element of the integrated circuit is used, a partial, and preferably slow, programming of the storage circuit is performed by the programming circuit. In this way, a few additional electrical charges collect in the storage circuit, and its programming level increases at each programming operation, namely at each use of the element of the integrated circuit.

The partial programming steps performed may be identical at each use of the sensitive element. The term "identical steps" will be understood herein to refer to steps having identical parameters, such as a duration or a quantity of energy given to the storage circuit, for example. In this case, the programming level of the storage circuit may be directly proportional to the number of uses of the element. It therefore gives a fairly precise indication of the number of real uses of the element.

Additionally, parameters of a partial programming step may vary as the sensitive element is used. It is possible, for example, to obtain variations in the duration of a step or in the quantity of energy given during a programming step as a function of the number of uses already made to give greater importance to the first or last uses of the element.

In certain cases, it is desirable to protect an integrated circuit including two or more sensitive elements (or an integrated circuit comprising one sensitive element) that uses or produces separate sensitive data. Preferably, a storage circuit including one or more storage cells will be chosen for this purpose.

In the case of the use of several storage cells, it is possible to associate a storage cell with the use of a single sensitive data type. It is also possible to associate a storage cell with the use of single sensitive element producing or using a single sensitive data type. In the case of the use of a storage circuit including a single storage cell, partial programming steps are performed at each use of one of the sensitive type (or at each use of one of the sensitive elements associated with the same sensitive data type), where the parameters of a programming step may be variable as a function of the sensitive element used and/or of the sensitive data used by the sensitive element.

This is especially valuable if the sensitive element produces or uses sensitive data having different degrees of importance, or data that is more or less easily detectable from the outside. Similarly, the method can be used in the case of an integrated circuit including one or more sensitive elements, where each sensitive element produces or uses one or more sensitive data types.

Whatever the implementation the level of programming of the storage circuit or circuits increases, as the case may be, at a speed that is higher or lower depending on the production or use of the sensitive data by the element of the integrated circuit. The programming level of either of the storage circuits represents, at least approximately, the number of partial programming steps performed, and hence on the number of uses of the element or elements of the integrated circuit.

Advantageously, the method according to the invention may also include measuring the programming level of the storage circuit and producing a warning signal if the level reaches a value representing a maximum number of permitted uses of the sensitive element. The measurement may be performed after each performance of a partial programming step, after the performance of a number M of programming steps, at the request of an external user, or even randomly. Further, the method may also include storing the warning signal to preserve a trace thereof.

BRIEF DESCRIPTION OF THE DRAWINGS

The invention will be understood more clearly, and other features and advantages will become apparent, from the following description of an exemplary embodiment of a use detection circuit according to the invention, the description being made with reference to the appended drawings, in which.

DETAILED DESCRIPTION OF THE PREFERRED EMBODIMENTS

Figure 1:
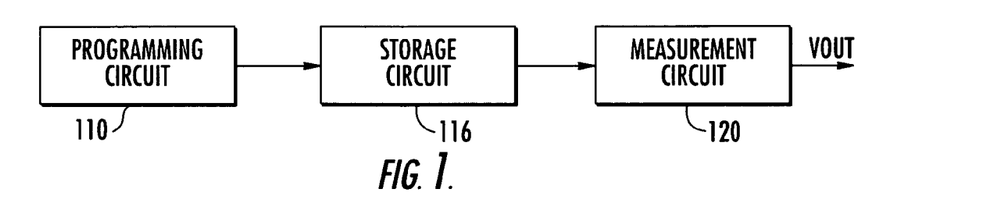
FIG. 1 is a basic schematic block diagram of a use detection circuit according to the invention.

The use detection circuit 100 illustrated in FIG. 1 includes a programming circuit 110, a non-volatile electrically programmable storage circuit 116 including one or more storage cells, and a measurement circuit 120. The circuit 100 is installed in an integrated circuit, one or more sensitive elements of which are to be protected against excessive use. Its general principle of operation has been explained above and will thus be summarized only briefly below.

At each use of a sensitive element associated with the use detection circuit, the circuit 100 carries out a partial programming of the circuit 116 so that the programming level of the circuit 116 represents the number of uses already made of the sensitive element. The circuit 120 measures the programming level of the circuit 116 and produces a warning signal VOUT if this level goes beyond a reference level representing a maximum number of authorized uses of the sensitive element. The circuit 120 can be activated, for example, after each programming of the circuit 116, every M programming operations (where M is an integer, for example, equal to 10) of the circuit 116, or else randomly. As described above, the programming level can be measured after each partial programming, after a number M of partial programming operations, at the user's request, or randomly.

Figure 2:
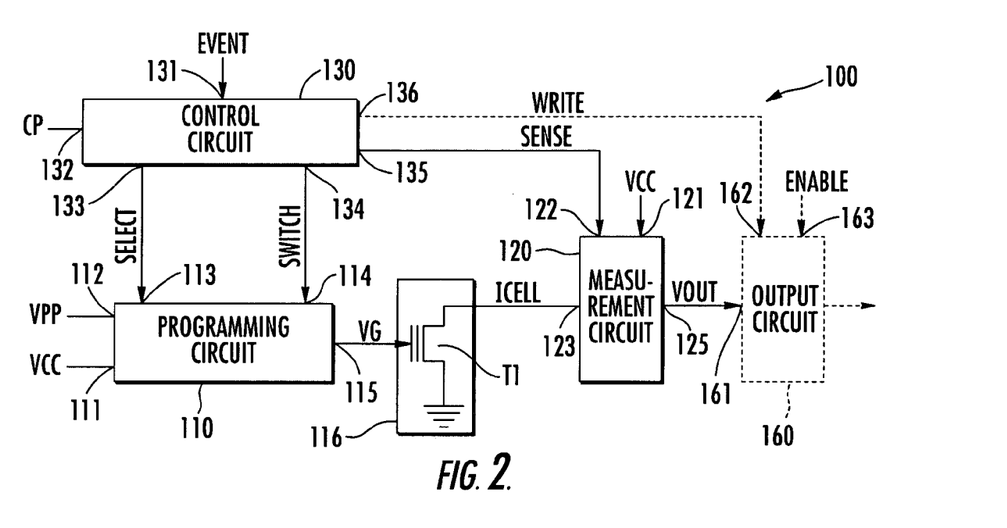
FIG. 2 is a more detailed schematic block diagram of the use detection circuit of FIG. 1.

An exemplary embodiment of a use detection circuit 100 used to carry out, at each use of an element, a partial programming of the storage circuit which is identical at each use of the element, and then to carry out a reading of the storage circuit, is illustrated in FIG. 2. The use detection circuit 100 of FIG. 2 includes a programming circuit 110, a storage circuit 116, a measurement circuit 120 and a control circuit 130.

The programming circuit 110 includes two supply input terminals 111, 112 to which there are respectively applied a supply potential VCC and a programming potential VPP, and two selection input terminals 113, 114 to which there are respectively applied a disabling signal SELECT and a programming signal SWITCH. The circuit 110 gives a control potential VG at an output terminal 115. This control potential VG assumes three values as a function of the signals SELECT and SWITCH:

VG=VPP if SELECT=1 and SWITCH=1,
VG=VCC if SELECT=1 and SWITCH=0, and
VG=0V if SELECT=0.

The circuit 116 is formed, in the example illustrated in FIG. 2, by a single EEPROM-type storage cell including a floating-gate storage transistor T1. The transistor T1 has a gate connected to the output terminal 115 of the switch 110, a source connected to a ground of the circuit, and a drain. The measurement circuit 120 has a power supply input terminal 121 to which the supply potential VCC is applied, a control input terminal 122 to which a measurement signal SENSE is applied, and an input terminal 123 connected to the drain of the transistor T1.

When the circuit 120 receives the read signal SENSE, it compares a current ICELL flowing in the channel of the storage transistor T1 with a reference current IREF and, at an output terminal 125, it gives a warning signal VOUT whose state represents the value of the current ICELL as compared with that of the reference current IREF. The control circuit 130 illustratively includes an input terminal 131 to which a use-indicating signal EVENT is applied, an input terminal 132 to which a clock signal CP is applied, two output terminals 133, 134 respectively connected to the input terminals 113, 114 of the circuit 110, and an output terminal 135. The circuit 130 gives, respectively, at the terminals 133, 134, 135, the control signals SELECT, SWITCH, and SENSE as a function of the signal EVENT.

In the example illustrated in FIG. 2, it is assumed that the signal EVENT is given in the form of a pulse by an element (such as an arithmetic and logic unit, a multiplication circuit, an encryption circuit, etc.) of the integrated circuit. More generally, the signal EVENT is given by an element (or a part of an element) that directly produces or uses sensitive data or by a control circuit that drives the element producing or using the sensitive data. It can also be given by an element when it executes a particular instruction or a particular series of instructions possibly implementing the data to be protected.

The full operation of the use detection circuit of FIG. 2 is as follows. When the circuit 130 receives a pulse EVENT indicating that the element whose use is to be detected is used, it then gives signals SELECT, SENSE, respectively equal to 1 and 0, and a potential VG equal to VPP is applied to the gate of the transistor T1. A partial programming of the transistor T1 is performed and its programming level is raised accordingly.

The circuit 130 then gives signals SELECT, SENSE, which are both equal to 1. The circuit 120 then measures the programming level of the storage transistor T1 in measuring the current ICELL flowing in the channel of the transistor T1. If ICELL is smaller than or equal to the reference current IREF, then the signal VOUT is equal to 1. Conversely, if ICELL is greater than IREF, then the signal VOUT is equal to 0 (it will be recalled that the current flowing in an EEPROM type storage cell is inversely proportional to its programming level).

Figure 3:
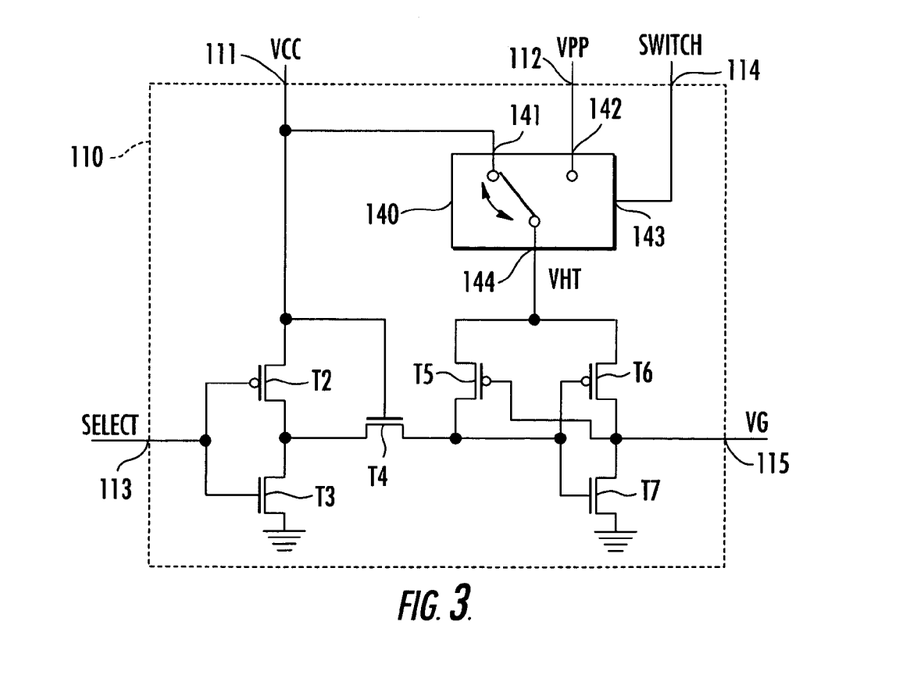
FIGS. 3 through 5 are schematic circuit diagrams illustrating in greater detail the programming circuit, measurement circuit, and control circuit of the use detection circuit of FIG. 2, respectively.

The programming circuit 110 illustratively includes, as shown in FIG. 3, six transistors T2 to T7 and one controlled switch 140. The switch 140 has two terminals 141, 142 and one control input terminal 143 respectively connected to the input terminals 111, 112 and 114 of the circuit 110. At an output terminal 144, the switch 140 gives a potential VHT which has the following characteristics:

VHT=VPP if SWITCH=1, and
VHT=VCC if SWITCH=0.

The transistor T2 is of the P type. Its source is connected to the terminal 111 of the circuit 110 and its drain is connected to the drain of the N type transistor T3, the source of which is connected to the ground of the circuit. The control gates of the transistor T2, T3 are connected together to the input 113 to receive the signal SELECT. The transistors T2, T3 form a logic inverter. At their drain, they give a signal that is the reverse of the signal SELECT.

The transistor T4 is an N type transistor. Its drain and its gate are respectively connected to the drain and to the source of the transistor T2. The transistor T5 is a P type transistor whose drain and source are connected respectively to the source of the transistor T4 and to the terminal 144 of the switch 140.

The transistor T6 is a P type transistor. Its source is connected to the terminal 144 of the switch 140 and its drain is connected to the drain of the N type transistor T7, the source of which is connected to the ground of the circuit. The drains of the transistor T6, T7 are connected together to the gate of the transistor T5 and to the output terminal 115, and their control gates are connected together to the drain of the transistor T4. The transistors T6, T7 form a high-voltage inverter. At their drain, they give a potential VG that is equal to the potential VHT if a zero potential is applied to their control gates, and they give a potential VG that is equal to a zero potential at their drain if a potential equal to the potential VCC is applied to their gate.

Figure 4:
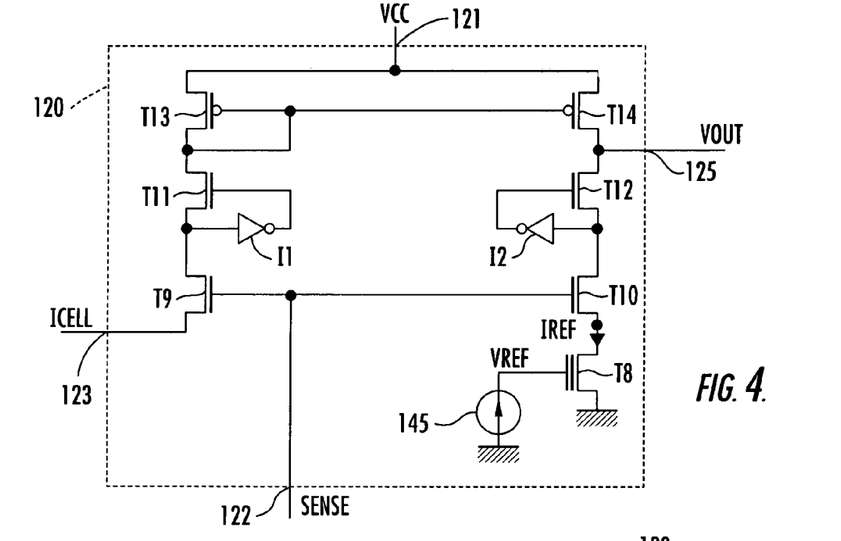
Figure 5:
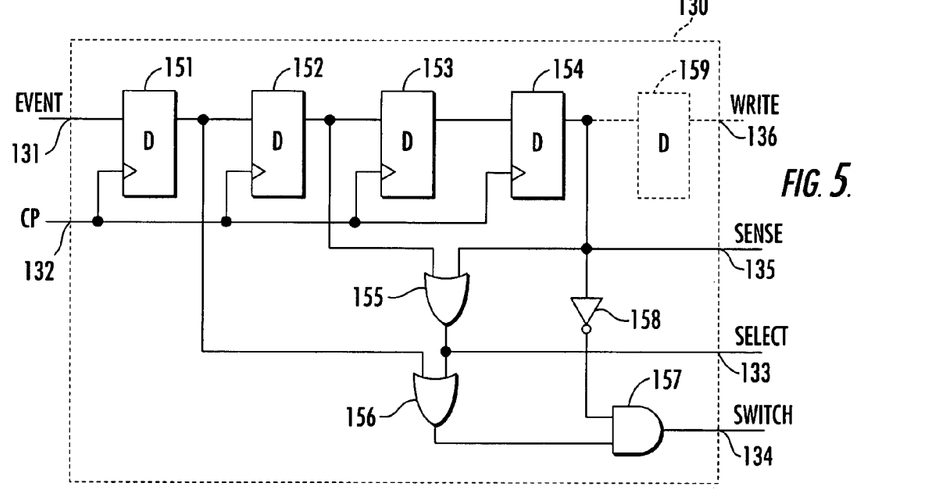

The measurement circuit 120, according to the drawing of FIG. 4, has seven transistors T8 to T14, two inverters I1, I2 and one bias potential source 145. In the example shown, the transistor T8 is considered to have a size identical to that of the transistor T1, the source of which is connected to the ground of the circuit and the control gate of which is connected to the positive terminal of the source 145, the negative terminal of which is grounded. The source 145 provides a given bias potential VREF at the gate of the storage transistor T8. A given bias current IREF then flows between the drain and the source of T8.

In the illustrated example, a transistor T8 has been chosen with a size identical to that of the transistor T1. The potential VREF of the bias source 145 is chosen in such a way that, when the potential VREF is applied to the gate of the transistor T8, the current IREF flowing in the drain of T8 is equal to the current flowing across a transistor identical to T8 which has undergone about N partial programming steps with a potential equal to VPP at its gate.

Other choices are also possible. For example, T1 could be taken to have a size N times the size of T8. This enables the direct comparison of the currents, in taking account of the scale factor, without having to use a large-sized transistor T8. Indeed, if it desired to count up a large number of uses on the transistor T1, it will be necessary to use a transistor T1 with a larger-sized floating gate so as not to quickly reach the maximum programming level of the transistor. In this case, a potential VREF will be chosen such that, when it is applied to the gate of T8, the current IREF flowing in the drain of T8 is equal to the current flowing across a transistor identical to T8 which has undergone a single programming step.

It is also possible to use several storage cells in succession. More generally, the choice of the transistor T1 of a storage cell, the transistor T8 of the circuit 120 and the source 145 is a function of several parameters. For example, these parameters include: the maximum number of uses permitted; parameters for performing the partial programming operations (e.g., duration, quantity of charges supplied, etc.); parameters for performing different partial programming operations according to the circuit element used should the activity of several elements be detected with a same detection circuit 100; the number of storage cells used, etc.

The transistors T9, T10 are N type transistors having their control gates connected together to the terminal 122 of the circuit 120. The source of the transistor T9 is connected to the terminal 123 and the source of the transistor T10 is connected to the drain of the transistor T8. The transistors T9, T10 disable the operation of the circuit 120 when the signal SENSE is inactive.

The transistors T11, T12 are N type transistors. The source of the transistor T11 is connected to its gate by the inverter I1 and to the drain of the transistor T9. The source of the transistor T12 is connected to its gate by the inverter I2 and to the drain of the transistor T10. The transistors T11, T12 have the function of keeping the potentials at the drains of the transistors T13, T14 constant whatever the value of the currents IREF, ICELL.

The transistors T13, T14, which form a current mirror, are P type transistors whose sources are connected together to the input terminal 121 to receive the potential VCC, and whose gates are connected together to the drain of the transistor T13. The drain of the transistor T14 is connected to the drain of the transistor T12 and the terminal 125.

In the example illustrated in FIG. 4, the control circuit 130 includes four D type latch circuits 151, 152, 153, 154, three logic gates 155, 156, 157, and one inverter 158. The four latch circuits each include one data input terminal, one clock input terminal, and one data output terminal. The four latch circuits are series-connected. The data input terminal of the first latch circuit 151 is connected to the input terminal 131 to receive the signal EVENT, and the output terminal of the fourth latch circuit 154 is connected to the terminal 135 at which the signal SENSE is given. The clock inputs of the four latch circuits are connected together to the terminal 132 to receive the same clock signal CP. Each latch circuit is equivalent to a delay circuit. Indeed, at its output, each latch circuit transmits, at its output, the signal that it has already received at its input at the previous clock cycle.

The logic gate 155, which is an OR type logic gate, includes two input terminals respectively connected to the output terminal of the latch circuit 152 and to the output terminal of the latch circuit 154. The gate 155 gives the signal SELECT at an output terminal connected to the terminal 133 of the circuit 130. The logic gate 156, which is an OR logic gate, includes two input terminals respectively connected to the output terminal of the first latch circuit 151 and the output terminal of the gate 155. The logic gate 157, which is an AND type gate, includes two input terminals respectively connected to the output terminal of the latch circuit 154 by the inverter 158, and to an output terminal of the gate 156. The gate 157 gives the signal SWITCH to an output terminal connected to the terminal 134 of the circuit 130.

Figure 6:
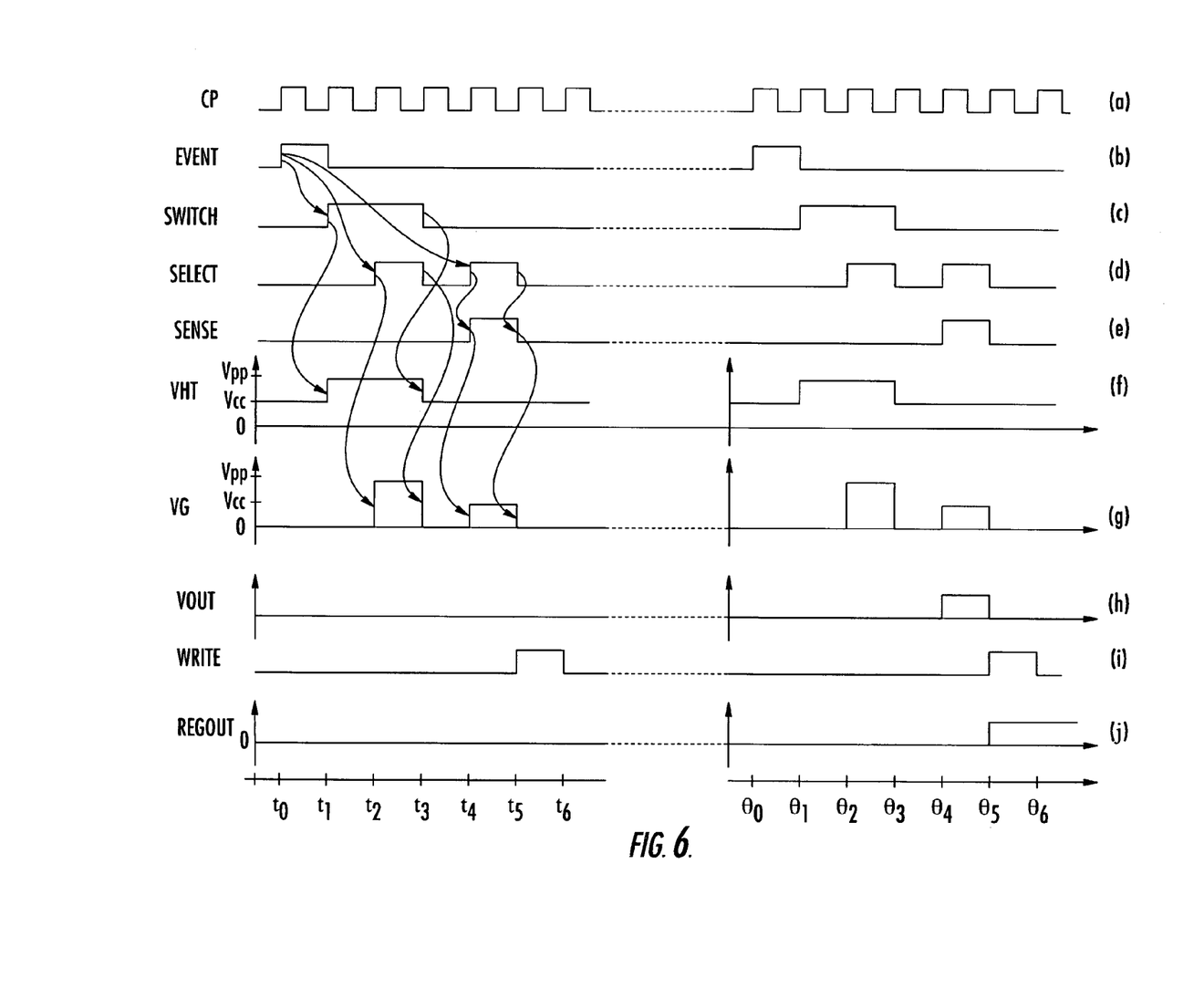
FIG. 6 is a timing diagram illustrating signals at different points of the circuits of FIGS. 3 through 5.

The overall function of the circuit of FIG. 2 will now be described with reference to FIG. 6. The signals (a)–(h) illustrated in FIG. 6 are respectively the timing diagrams of the signals CP, EVENT, SWITCH, SELECT, SENSE and of the potentials VHT, VG and VOUT at different points of the circuit 100 of FIG. 2. The circuit illustrated in FIG. 2 tells a user whether or not a maximum number N of permitted uses of an integrated circuit element has been reached.

In the illustrated example, the transistors T1, T8 are identical in size, and the source 145 is chosen accordingly as indicated earlier. All the partial programming steps are identical, especially in terms of potentials applied to the electrodes of the transistor T1 and in terms of programming time. Initially, the logic signals EVENT, SELECT, SWITCH, SENSE are equal to logic 0, the potential VHT at the output terminal of the switch 140 is equal to VCC, and the potentials VG and VOUT are zero.

The first part of the timing diagram shows the progress of the signal when an nth pulse EVENT is received by the circuit 130, n being an integer smaller than the maximum number N. The passage to logic 1 of the signal EVENT at the instant t0 causes the passage to logic 1 of the signal SWITCH one clock cycle CP later at the instant t1, and it causes the passage to logic 1 of the signal SELECT at the instant t2.

When the signal SWITCH goes to logic 1, the switch 140 switches over and gives a potential VHT equal to VPP at its terminal 144. Since the signal SELECT is equal to logic 0, the circuit 110 gives a zero potential VG. When the signal SELECT goes to logic 1 at the instant t2, the potential VG takes the value VPP and is applied to the control gate of the transistor T1 whose source is at a zero potential and whose drain is at a floating potential because the measurement circuit is inactive (SENSE=logic 0 and the transistors T9, T10 are off). Some electrical charges are stored in the floating gate of the transistor T1 during a clock cycle and its programming level rises slightly without, however, going beyond a maximum value representing the number N.

At the instant t3, one clock cycle later, the signals SELECT and SWITCH go from logic 1 to logic 0, the switch 140 switches over, the potential VHT takes the value VCC and the potential VG becomes zero. The nth partial programming of the transistor T1 is completed. At the instant t4, the signals SENSE and SELECT go from logic 0 to logic 1. The potential VHT is maintained at a level equal to VCC because the signal SWITCH is equal to logic 0. Since the signal SELECT is equal to logic 1, the potential VG takes the value VCC and is applied to the gate of the transistor T1, whose source is grounded. Since the signal SENSE is equal to logic 1, the transistors T9, T10 are on and a current ICELL flows between the source of the transistor T9 and the source of the transistor T1. The current ICELL represents the programming level of the transistor T1, namely the number n.

The circuit 120 compares the current ICELL to the current IREF flowing in the transistor T8. Since n is smaller than N, the current ICELL is greater than the current IREF, and the warning signal VOUT remains inactive. At the instant t5, the signal SELECT goes to logic 0 and the potential VG returns to zero. Furthermore, the signal SENSE goes to logic 0, the transistors T9, T10 go off, the current ICELL disappears and the warning signal VOUT remains inactive.

In short, when the nth pulse EVENT is received by the control circuit 130 of the detection circuit 100 at the instant t0, an nth partial programming step of the transistor T1 is performed between t2 and t3, the programming level of T1 is measured between t4 and t5, and then the measured programming level is finally compared with a reference level (associated with the number N). Since the maximum number N is not attained, the warning signal VOUT remains inactive.

The second part of the timing diagram shows the progress of the signals when an mth pulse EVENT is received by the circuit 130, m being an integer greater than or equal to the maximum number N. The passage to logic 1 of the signal EVENT at the instant θ0 causes the passage to logic 1 of the signal SWITCH at the instant θ1, and the passage to logic 1 of the signal SELECT at the instant θ2. When the signal SWITCH goes to logic 1, the circuit 110 gives a zero potential VG.

When the signal SELECT goes to logic 1 at the instant θ2, the potential VG takes the value VPP, an mth partial programming step of the transistor T1 takes place. That is, its programming level rises slightly and is greater than or equal to the maximum value representing the number N. At the instant θ3, the signals SELECT and SWITCH go from logic 1 to logic 0, the potential VHT assumes the value VCC, and the potential VG becomes zero. The programming of the transistor T1 is then completed.

At the instant θ4, the signals SENSE and SELECT go from logic 0 to logic 1. The potential VHT is kept at a level equal to VCC because the signal SWITCH is equal to logic 0. Since the signal SELECT is equal to logic 1, the potential VG takes the value VCC. Since the signal SENSE is equal to logic 1, the transistors T9, T10 are on and a current ICELL flows between the source of the transistor T9 and the source of the transistor T1. The circuit 120 compares the current ICELL with the bias current flowing in the transistor T8. Since m is greater than or equal to N, the current ICELL is lower than or equal to the current IREF, and the warning signal VOUT becomes active in taking the value VCC.

At the instant θ5, the signal SELECT goes to logic 0 and the potential VG returns to zero. Furthermore, the signal SENSE goes to logic 0, the transistors T9, T10 go off, the current ICELL disappears and the potential VOUT returns to zero.

In short, when the mth pulse EVENT is given by the detection circuit at the instant θ0, an mth programming step of the transistor T1 is performed between θ2 and θ3, and then the programming level of T1 is measured between θ4 and θ5. The measured programming level is compared with the reference level. Since the maximum level is reached (the number N is reached), the potential VOUT becomes active to indicate that the reference level has been reached or crossed, and then becomes inactive again at the instant θ6.

FIGS. 1 to 5 illustrate one potential embodiment that in no way restricts the scope of the invention. Modifications may be made in the elements of the use detection circuit 100 without departing from the scope of the invention.

The measurement circuit 120 is used solely to read the contents of the storage circuit 116. The circuit 120 is not required and may be omitted in some embodiments. This is especially the case if the storage circuit is capable of activating an alarm taken into account by another element of the integrated circuit, or if it is capable of activating an interruption managed by a switching unit of the integrated circuit.

In the above example, the duration of the signals SENSE, SELECT, and SWITCH has been chosen to equal one or more cycles of the clock signal. The duration of these signals is fixed by the duration of the delays introduced by the latch circuits 151 to 154 of the circuit 130. However, these signals may have different durations. The essential point is that the signals should have a duration sufficient for the efficient and satisfactory performance of a partial programming step or a measurement step, as the case may be. Preferably, however, the signal SWITCH is produced before the signal SENSE so that the programming step is performed before the measurement step.

The frequency with which the measurement steps are performed may also be modified. It is possible not to perform the measurement step routinely after each partial programming step, but to perform a measurement step only during specific checks on the number of uses, as discussed above.

The storage circuit 116 can also be modified. Similarly, it is possible to use not just one storage cell but several such cells successively as the partial programming steps are performed. This makes it possible, for the same number of uses counted up, to reduce the number of partial programming operations per storage cell and thus reduce the sizing constraints on these cells. It is also possible to make the number of accepted uses a parameter by using a larger number of cells, for example.

Although the use of an EEPROM cell has been described in the above example, it is of course possible to use cells of another type, such as FLASH type cells. More generally, any other electrically programmable storage circuit may be used which can have its programming level modified several times by partial programming operations, and that enables the non-volatile storage of the counted number of uses.

Modifications can also be made to the programming circuit 110 illustrated in FIG. 3. The circuit 100 illustrated in FIG. 2 uses a single programming potential VPP. The value of this potential fixes the quantity of charges stored in the cell 116 when carrying out a programming step of a given duration.

It is also possible to use several programming potentials VPP1, VPP2, preferably different potentials, to carry out different partial programming steps. This may be valuable especially when the integrated circuit uses several elements of different sensitivity, which are to be monitored by a single storage circuit. The circuit 110, of course, may require modification accordingly.

Furthermore, the transistors T2, T3 of the circuit 110 have the role of inverting the signal SELECT. They may be replaced by any other circuit capable of inverting the logic signals. Similarly, the transistors T6, T7 may be replaced by a high-voltage inverter, which gives a high potential if a zero logic signal is applied to its input, and gives a zero potential if a logic signal equal to logic 1 is applied to its input.

The transistor T4 is an isolation transistor that prevents the voltage at the drains of the transistors from reaching the level of the potential VPP should the potential VPP appear at the gates of the transistors T6, T7. The transistor T4 may be omitted if necessary. In this case, the drain of T5 and the gates of T6, T7 will be connected together to the drains of the transistors T2, T3.

The transistor T5 is a safety element used to lock the potential VG at 0 V when the signal SELECT is zero. The transistor T5 may be omitted if necessary. In general, the circuit 110 is a circuit that gives an output potential VG that takes three values as a function of two (or more) selection signals SELECT, SWITCH. It may be replaced by any circuit fulfilling this function.

Modifications may also be made in the read circuit 120. For example, the transistors T11, T12 and the inverter I1, I2 are used to limit the potential at the drain of the transistors T1, T8. These elements may be eliminated if the storage transistors T1, T8 are sized to withstand slightly higher potentials.

The circuit 130 of FIG. 4 is only an example of a circuit giving the signals, SELECT, SWITCH and SENSE. Other control circuits may be used, especially circuits including sets of gates and/or latch circuits different from the one described herein by way of an example. Furthermore, the D type latch circuits that are used as delay circuits may be replaced by any other circuit having a similar function. The essential point is that, to implement the invention, there should be a control circuit providing signals SELECT, SWITCH and SENSE with the characteristics needed for the efficient operation of the circuits 110, 120. Namely, these signals are used to first carry out a step for partial programming of the storage circuit T1 and, if necessary, a step for measuring the level of programming of the circuit 116 and a comparison of this level with a reference level.

The circuit of FIG. 2 can also be improved by adding a circuit 160 to store the passage to logic 1 of the signal VOUT. A circuit 160 of this kind is shown in dashes in FIG. 2. It has an input terminal 161 connected to the terminal 125 of the circuit 120, an input terminal 162 connected to a terminal 136 of the circuit 130 to receive a write signal WRITE and an input terminal 163 to receive a control signal ENABLE from a user of the circuit.

The circuit 160 stores the value of the active or inactive signal VOUT, whenever it receives the active signal WRITE, and it gives out the previously stored value of the signal VOUT whenever it receives an active signal ENABLE. The signal WRITE is produced by the control circuit 130 after each partial programming step, every M partial programming steps, or randomly, depending on the embodiment of the circuit. The signal ENABLE is produced by an external user when he wishes to know whether a warning signal has been sent or not.

Figure 7:
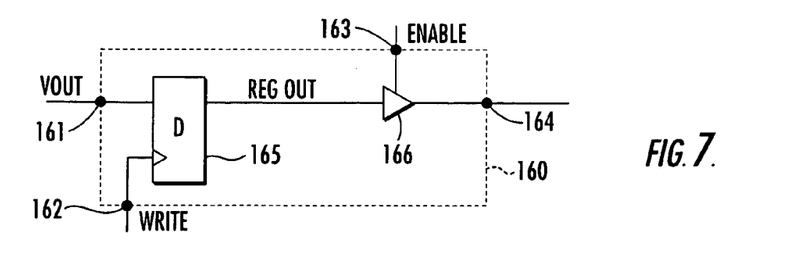
FIG. 7 is a schematic circuit diagram illustrating in further detail one embodiment of the output circuit of the use detection circuit of FIG. 2.

An exemplary circuit 160 is shown in FIG. 7 and illustratively includes a latch circuit 165 and a buffer memory 166. The latch circuit 165 has a data input terminal and a clock input terminal that are connected respectively to the terminals 161, 162 of the circuit 160. The memory 166 has an input terminal connected to a data output terminal of the latch circuit 165 to receive a signal REGOUT and an input terminal connected to the terminal 163 to receive the signal ENABLE.

The signal WRITE is given by the circuit 130. In the example shown in FIGS. 2 to 6, it is equal to the signal SENSE delayed by one cycle of the clock signal. For this purpose, a fifth latch circuit 159 (shown in dashes in FIG. 5) is simply added to the circuit 130. A data input terminal of this latch circuit 159 is connected to the output terminal of the latch circuit 154 and an output terminal of this latch circuit 159 is connected to the terminal 136.

The circuit 160 works as follows. Initially, the signals WRITE, ENABLE and REGOUT are at zero. They are shown at (i) and (j), respectively, in FIG. 6. At the nth pulse EVENT, when the signal SENSE goes to logic 0 at the instant t6, the signal WRITE goes to logic 1 and the signal REGOUT remains at zero because the signal VOUT is inactive. Similarly, at the mth pulse EVENT, when the signal SENSE goes to logic 0 at the instant θ6, the signal WRITE goes to logic 1, the signal REGOUT goes to logic 1 and it is kept equal to logic 1. At any time, when an external signal ENABLE is received, the signal REGOUT is stored in the memory 166 and provided externally.

The invention claimed is:

1. A use detection circuit to detect usage of at least one integrated circuit element comprising:
   a non-volatile electrically programmable storage circuit;
   a programming circuit for incrementally increasing a programming level of said storage circuit based upon usage of the at least one integrated circuit element so that the programming level corresponds to a number of uses of the at least one integrated circuit element; and
   measurement circuit connected to said storage circuit for reading the programming level and providing a warning signal if the programming level exceeds a threshold number of permitted uses of the at least one integrated circuit element.

2. The use detection circuit of claim 1 further comprising an output circuit connected to said measurement circuit for storing the warning signal.

3. The use detection circuit of claim 1 wherein said storage cell comprises at least one of an erasable programmable read only memory (EPROM) cell, an electrically erasable programmable read only memory (EEPROM) cell, and a FLASH memory cell.

4. The use detection circuit of claim 1 wherein said storage circuit comprises a plurality of storage cells; wherein said programming circuit causes each storage cell to be successively programmed as the programming level of a preceding storage cell is incrementally increased to a maximum level; and wherein the number of uses of the at least one integrated circuit element corresponds to a sum of the programming levels of said storage cells.

5. The use detection circuit of claim 1 wherein the at least one integrated circuit element comprises a plurality of integrated circuit elements; wherein said storage circuit comprises a respective storage cell for each integrated circuit element; and wherein said programming circuit causes programming levels of said storage cells to be incrementally increased based upon usage of respective integrated circuit elements.

6. The use detection circuit of claim 1 further comprising a control circuit connected to said programming circuit and said storage circuit for receiving a use signal indicative of use of the at least one integrated circuit element and controlling said programming circuit and storage circuit based thereon.

7. The use detection circuit of claim 1 wherein the at least one integrated circuit element comprises at least one of an identification circuit, a cryptographic computation circuit, and at least one instruction performed by the integrated circuit.

8. A use detection circuit to detect usage of at least one integrated circuit element comprising:
   a non-volatile electrically programmable storage circuit comprising at least one programmable storage cell;
   a programming circuit for incrementally increasing a programming level of said at least one programmable storage cell based upon usage of the at least one integrated circuit element so that the programming level corresponds to a number of uses of the at least one integrated circuit element; and a measurement circuit connected to said storage circuit for reading the programming level and providing a warning signal if the programming level exceeds a threshold number of permitted uses of the at least one integrated circuit element.

9. The use detection circuit of claim 8 further comprising an output circuit connected to said measurement circuit for storing the warning signal.

10. The use detection circuit of claim 8 wherein said at least one programmable storage cell comprises at least one of an erasable programmable read only memory (EPROM) cell, an electrically erasable programmable read only memory (EEPROM) cell, and a FLASH memory cell.

11. The use detection circuit of claim 8 wherein said at least one programmable storage cell comprises a plurality of storage cells; wherein said programming circuit causes each storage cell to be successively programmed as the programming level of a preceding storage cell is incrementally increased to a maximum level; and wherein the number of uses of the at least one integrated circuit element corresponds to a sum of the programming levels of said storage cells.

12. The use detection circuit of claim 8 wherein the at least one integrated circuit element comprises a plurality of integrated circuit elements; wherein said at least one programmable storage cell comprises a respective storage cell for each integrated circuit element; and wherein said programming circuit causes programming levels of said storage cells to be incrementally increased based upon usage of respective integrated circuit elements.

13. The use detection circuit of claim 8 further comprising a control circuit connected to said programming circuit and said storage circuit for receiving a use signal indicative of use of the at least one integrated circuit element and controlling said programming circuit and storage circuit based thereon.

14. The use detection circuit of claim 8 wherein the at least one integrated circuit element comprises at least one of an identification circuit, a cryptographic computation circuit, and at least one instruction performed by the integrated circuit.

15. A security device comprising:
a substrate;
an integrated circuit carried by said substrate and comprising at least one element; and
a use detection circuit to detect usage of the at least one element and comprising
a non-volatile electrically programmable storage circuit,
a programming circuit for incrementally increasing a programming level of said storage circuit based upon usage of the at least one integrated circuit element so that the programming level corresponds to a number of uses of the at least one integrated circuit element, and measurement circuit connected to said storage circuit for reading the programming level and providing a warning signal if the programming level exceeds a threshold number of permitted uses of the at least one integrated circuit element.

16. The security device of claim 15 wherein said use detection circuit further comprises an output circuit connected to said measurement circuit for storing the warning signal.

17. The security device of claim 15 wherein said storage circuit comprises at least one programmable storage cell.

18. The security device of claim 17 wherein said storage cell comprises at least one of an erasable programmable read only memory (EPROM) cell, an electrically erasable programmable read only memory (EEPROM) cell, and a FLASH memory cell.

19. The security device of claim 15 wherein said storage circuit comprises a plurality of storage cells; wherein said programming circuit causes each storage cell to be successively programmed as the programming level of a preceding storage cell is incrementally increased to a maximum level; and wherein the number of uses of the at least one element corresponds to a sum of the programming levels of said storage cells.

20. The security device of claim 15 wherein the at least one element comprises a plurality of elements; wherein said storage circuit comprises a respective storage cell for each element; and wherein said programming circuit causes the programming levels of said storage cells to be incrementally increased based upon usage of respective elements.

21. The security device of claim 15 wherein said use detection circuit further comprises a control circuit connected to said programming circuit and said storage circuit for receiving a use signal indicative of use of the at least one element and controlling said programming circuit and storage circuit based thereon.

22. The security device of claim 15 wherein the at least one element comprises at least one of an identification circuit, a cryptographic computation circuit, and at least one instruction performed by said integrated circuit.

23. The security device of claim 15 wherein said substrate comprises a security card.

24. A method for detecting usage of at least one integrated circuit element comprising:
incrementally increasing a programming level of an electrically programmable non-volatile storage circuit based upon usage of the at least one integrated circuit element so that the programming level corresponds to a number of uses of the at least one integrated circuit; and measurement the programming level of the storage circuit and providing a warning signal if the programming level exceeds a threshold number of permitted uses of the element.

25. The method of claim 24 wherein incrementally increasing comprises incrementally increasing the programming level in substantially equal amounts.

26. The method of claim 25 wherein incrementally increasing comprises varying an amount of the incremental increase based upon a number of prior uses of the at least one integrated circuit element.

27. The method of claim 24 wherein the storage circuit comprises a plurality of storage cells; wherein incrementally increasing comprises incrementally increasing programming levels of the storage cells in succession as the programming level of a preceding storage cell reaches a maximum level; and wherein the number of uses of the at least one integrated circuit element corresponds to a sum of the programming levels of the storage cells.

28. The method of claim 24 wherein the at least one integrated circuit element comprises a plurality of integrated circuit elements; wherein the storage circuit comprises a respective storage cell of each integrated circuit element; and wherein incrementally increasing comprises incrementally increasing the storage cells based upon usage of respective integrated circuit elements.

* * * * *